United States Patent
Tanabe (10) Patent No.: US 10,168,395 B2
(45) Date of Patent: Jan. 1, 2019

(54) MAGNETIC SENSOR

(71) Applicant: TDK CORPORATION, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 208 days.

(21) Appl. No.: 15/069,462

(22) Filed: Mar. 14, 2016

(65) Prior Publication Data

US 2016/0266216 A1 Sep. 15, 2016

(30) Foreign Application Priority Data

Mar. 12, 2015 (JP) ................................. 2015-049728
Feb. 17, 2016 (JP) ................................. 2016-027516

(51) Int. Cl.
*G01R 33/09* (2006.01)

(52) U.S. Cl.
CPC ......... *G01R 33/091* (2013.01); *G01R 33/093* (2013.01)

(58) Field of Classification Search
CPC .... G01R 33/00; G01R 33/0005; G01R 33/09; G01R 33/091; G01R 33/093; G01R 33/095; G01R 33/096; G01R 33/098
See application file for complete search history.

(56) References Cited

U.S. PATENT DOCUMENTS

2009/0322325 A1* 12/2009 Ausserlechner ....... G01D 5/145
 324/260
2015/0177286 A1* 6/2015 Fuji .................... G01R 33/0005
 324/144

FOREIGN PATENT DOCUMENTS

| JP | 2009276159 A | * | 11/2009 | ......... G01R 33/0005 |
| JP | 5500785 B2 | | 5/2014 | |
| JP | 5597206 B2 | | 10/2014 | |

* cited by examiner

*Primary Examiner* — Son Le
(74) *Attorney, Agent, or Firm* — Oliff PLC (57) ABSTRACT

The present invention relates to a magnetic sensor which can improve the detection precision of a weak magnetic field. A magnetic sensor wherein a magnetic body which changes the direction of a magnetic field input to a magnetoresistance effect element is provided in the vicinity of the magnetoresistance effect element in which the resistance value changes according to the direction of the input magnetic field, and the magnetic body has a recess with a concave shape on the surface at a side where the magnetoresistance effect element is formed. The center of the recess may be substantially identical to that of the magnetic body. The concave shape may at least include polygon having three or more sides, or may at least include arc.

13 Claims, 10 Drawing Sheets

Configuration of the conventional sensor (plane invovling X-Z axis)

Fig.3

Configuration of the conventional sensor (plane invovling X-Y axis)

Fig.4

Magnetic flux in GMR element part from example of prior art

Fig.5

Configuration of the sensor from Embodiment 1 (plane invovling X-Z axis)

Fig.6

Configuration of the sensor from Embodiment 1 (plane invovling X-Y axis)

Magnetic flux in GMR element part from example of prior art

Fig.9

Magnetic flux in GMR element part from Embodiment 1

Configuration of the sensor from Embodiment 2 (plane invovling X-Y axis)

Fig.13

Magnetic flux in GMR element part from Embodiment 2

Configuration of the sensor from Embodiment 3 (plane invovling X-Y axis)

Fig.17

Magnetic flux in GMR element part from Embodiment 3

MAGNETIC SENSOR

The present invention relates to a magnetic sensor, especially a magnetic sensor utilizing a magnetoresistance effect element.

BACKGROUND

A magnetic sensor capable of detecting the change of the magnetic field is developed as a measuring device and used in various applications such as the galvanometer, the magnetic encoder and the like. One example of such a magnetic sensor is disclosed in the following Patent Document 1 in which a GMR element (Giant Magneto Resistive element) is used as the element for detecting the change of the magnetic field. The GMR element is a kind of element in which the output resistance value changes according to the input magnetic field, and the change of the magnetic field to be detected can be measured based on the output resistance value.

As one example showing the specific configuration of the magnetic sensor where the GMR element is used, as described in Patent Document 1, four GMR elements are provided in the substrate to form a bridge circuit. As such, the change of the resistance value in the GMR element is detected by detecting the differential voltage in the bridge circuit, wherein the change of the resistance value in the GMR element is with the change of the magnetic field which becomes a detection object. In this respect, a sensor that is highly sensitive to the change of magnetic field has been provided.

In particular, as an element to detect the change of magnetic field, a GMR chip (the chip for detecting magnetic field) is provided in the magnetic sensor as disclosed in Patent Document 1, wherein the GMR chip utilizes the spin valve typed GMR elements (Giant Magneto Resistive element) in which the output resistance value changes depending on the direction of the input magnetic field. As such, each GMR element is magnetized fixedly in a specific direction in one surface so as to detect the magnetic field in the specified direction. Here, in order to downsize the GMR chip and also to lower the deviation in each resistance value, four GMR elements which have already formed the bridge circuit are provided on one GMR chip. Thus, all four GMR elements are magnetized fixedly in the same direction.

Figure 1:
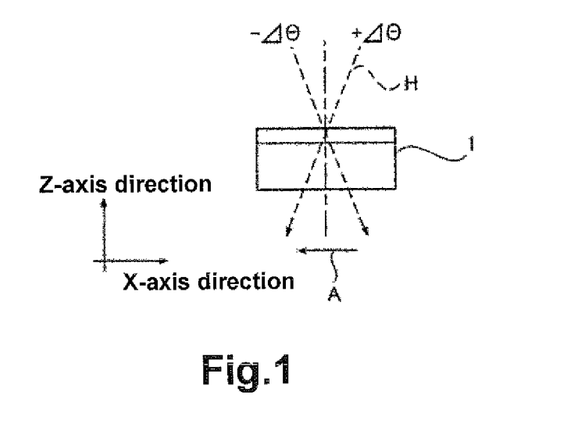
FIG. 1 is a view showing the configuration of the GMR chip.
Figure 2:
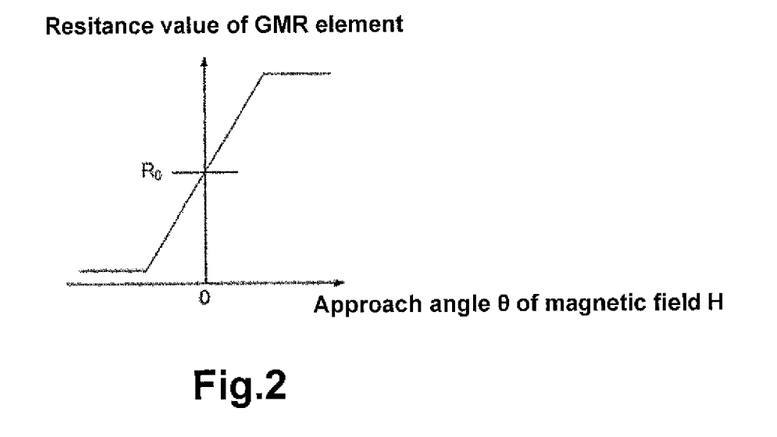
FIG. 2 is a diagram showing the characteristic of the GMR element.

FIG. 1 and FIG. 2 illustrate the characteristic of the GMR element. First of all, the characteristic of the GMR element used in the present invention will be described with reference to FIG. 1 and FIG. 2. The GMR element is the GMR element (Giant Magneto Resistive element) made in the spin valve type in which output resistance value changes depending on the direction of the input magnetic field. As such, in FIG. 1 and FIG. 2, the relationship between the approach angle and the resistance value is shown, wherein the approach angle refers to the angle of magnetic field H relative to the GMR element.

In the example as shown in FIG. 1, GMR elements are formed on the upper surface of GMR chip 1. The GMR elements are arranged in such a manner that they are magnetized fixedly in the direction indicated by arrow A. Thus, the magnetic field in the direction as indicated by arrow A can be detected.

In FIG. 1, the GMR elements are arranged in magnetic field H that enters in the direction perpendicular to the form surface of the GMR elements. In this respect, the resistance value of the GMR element turns to "$R_0$" as shown in FIG. 2. In contrast, if the direction of magnetic field inclines, the incidence angle of magnetic field H relative to the GMR element surface deviates from the perpendicular direction with an angle of i.e., $-\Delta\theta$ or $+\Delta\theta$, as shown in FIG. 1 with dotted lines, wherein $\Delta$(Delta) refers to the variation. In this way, the GMR element is magnetized fixedly in one direction and the resistance value of the GMR element changes when the direction of the magnetic field changes with respect to said direction, as shown in FIG. 2. As such, the GMR element has the following characteristic. If the resistance value is defined as $R_0$ when the magnetic field enters in a perpendicular direction, the resistance value will have substantial change when the direction of the magnetic field H inclines with a tiny angle.

Figure 3:
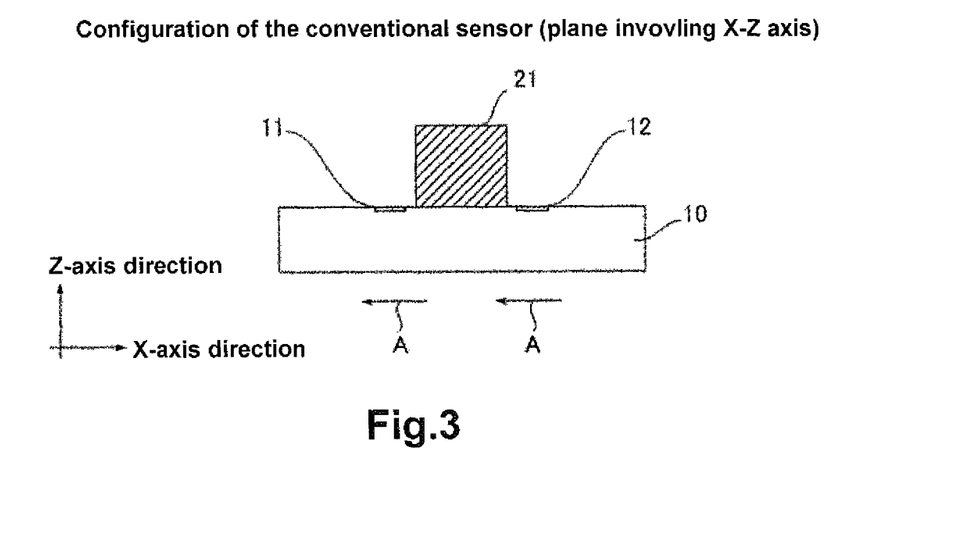
FIG. 3 is a view showing the configuration of the conventional magnetic sensor (the surface involving X-Z axis).
Figure 4:
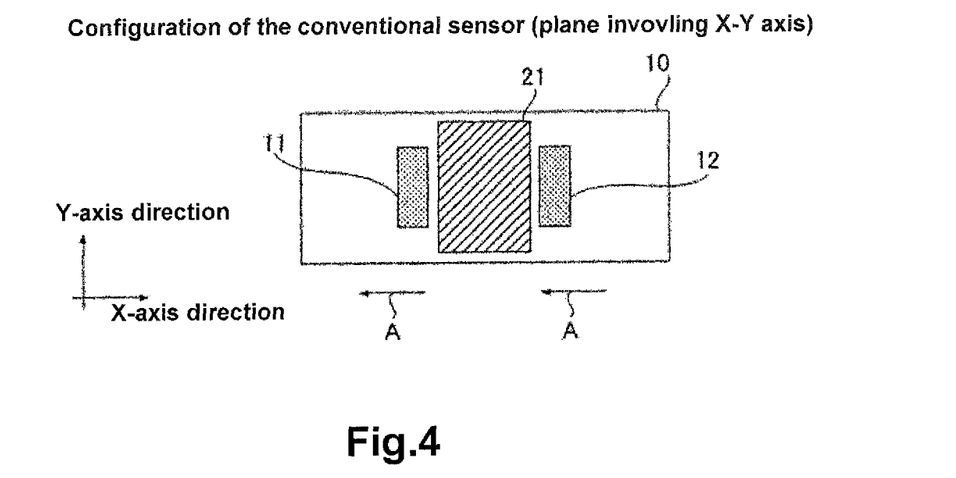
FIG. 4 is a view showing the configuration of the conventional magnetic sensor (the surface involving X-Y axis).

FIG. 3 and FIG. 4 show the configuration of the conventional magnetic sensor. When the magnetic field in one direction is detected by using a GMR chip where the bridge circuit as described above has been formed, magnetic body 21 which changes the direction of the magnetic field input to the GMR element is provided in the vicinity of the element forming part where the GMR elements in pair that are adjacent but not connected to each other in the bridge circuit are provided at almost symmetrical positions, as described in Patent Document 1.

Further, magnetic body 21 can change the external magnetic field in one direction into a different direction between the GMR elements. In this way, four GMR elements inside the bridge circuit are provided in such a manner that the magnetic field comes out in the direction in which the magnetization is fixed relative to one and comes out in the opposite direction relative to another one. As such, a high differential voltage is output from the bridge circuit, and the magnetic field in one direction can be detected in precision.

Figure 5:
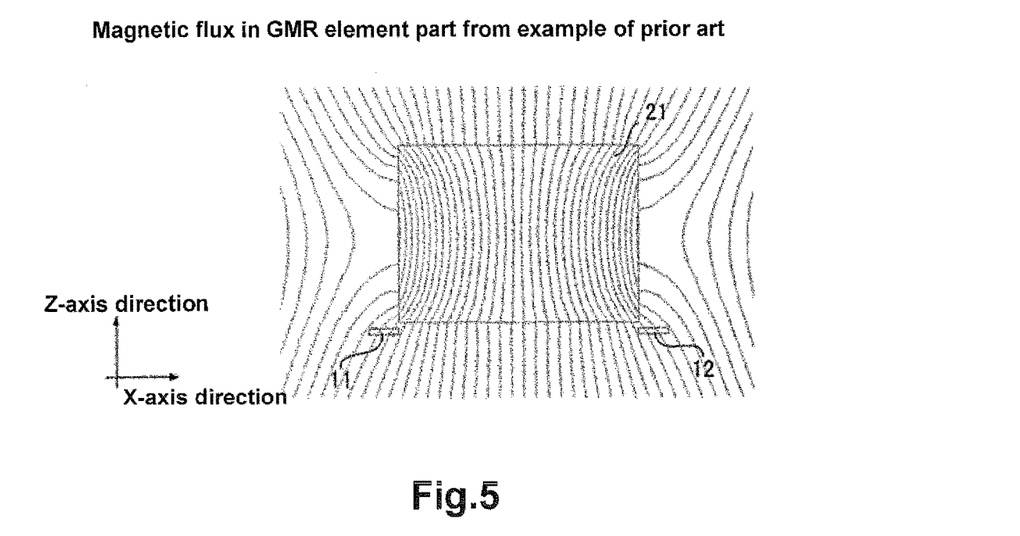
FIG. 5 is a schematic view showing the magnetic flux introduced to the GMR element part in the example of prior art.

FIG. 5 is a schematic view showing the magnetic field H introduced to the GMR element parts 11 and 12 through magnetic body 21 as described in Patent Document 1. The magnetic field bends due to magnetic body 21, and the component of the magnetic field is generated in the GMR element parts 11 and 12 in the direction of the induced magnetic field (magnetic field component in the X-axis direction) and the resistance value of said GMR element changes. Thus, the sensor is provided which is highly sensitive to the change of the magnetic field. In addition, in the following description, the direction parallel to that where the GMR element is magnetized fixedly is defined as the X-axis direction, and the direction which is perpendicular to that where the GMR element is magnetized fixedly and also is located on the surface where the GMR elements are formed is defined as the Y-axis direction. Further, the direction perpendicular to the surface where the GMR elements are formed is defined as the Z-axis direction.

Patent Document 2 has disclosed a sensor in which several magnetic bodies are provided for the magnetoresistance effect element to convert the external magnetic field in the vertical direction into magnetic field component in the horizontal direction so that the component of the magnetic field entering in the vertical direction is detected.

PATENT DOCUMENTS

Patent Document 1: JP-P5500785
Patent Document 2: JP-P5597206

SUMMARY

However, in the techniques disclosed in Patent Document 1 and Patent Document 2, the following problem exists. That is, in the detection of a weak magnetic field, the intensity of the magnetic field coming out of the element part is not sufficiently high. Thus, it is necessary to improve the detection precision.

Thus, the objective of the present invention is to solve the technical problem mentioned above. That is, the present invention aims to improve the detection precision of the magnetic sensor with an easy and convenient configuration.

Here, the magnetic sensor according to one embodiment of the present invention, wherein a magnetic body which changes the direction of a magnetic field input to a magnetoresistance effect element is provided in the vicinity of the magnetoresistance effect element in which the resistance value changes according to the direction of the input magnetic field, and the magnetic body has a recess with a concave shape on the surface at a side where the magnetoresistance effect element is formed. In this way, the magnetic field to be detected is introduced to the magnetoresistance effect element effectively to improve the detection precision.

Preferably, the recess of the magnetic body is provided on the side of the placement surface of the magnetic body, and the center of the recess is substantially identical to that of the magnetic body in the perpendicular direction of the placement surface of the magnetoresistance effect element.

Further, the concave shape may at least include polygon having three or more sides, or may at least include arc. More preferably, the magnetic body is the soft magnetic body.

According to the invention mentioned above, the detection precision of the magnetic sensor can be improved by introducing the magnetic field to be detected to the magnetoresistance effect element through the recess of the magnetic body.

DETAILED DESCRIPTION OF EMBODIMENTS

The specific configuration in the present invention will be described in the following embodiments. Hereinafter, the basic configuration of the magnetic sensor in the present invention will be described in Embodiment 1, and the configuration of the magnetic sensor to be specifically used in to the present invention will be described in Embodiments 2 to 3.

The GMR element is described as an example of the magnetoresistance effect element, but the element involving the magneto-resistance effect can also be used, including the TMR element, AMR element and the like.

(Embodiment 1)

Figure 6:
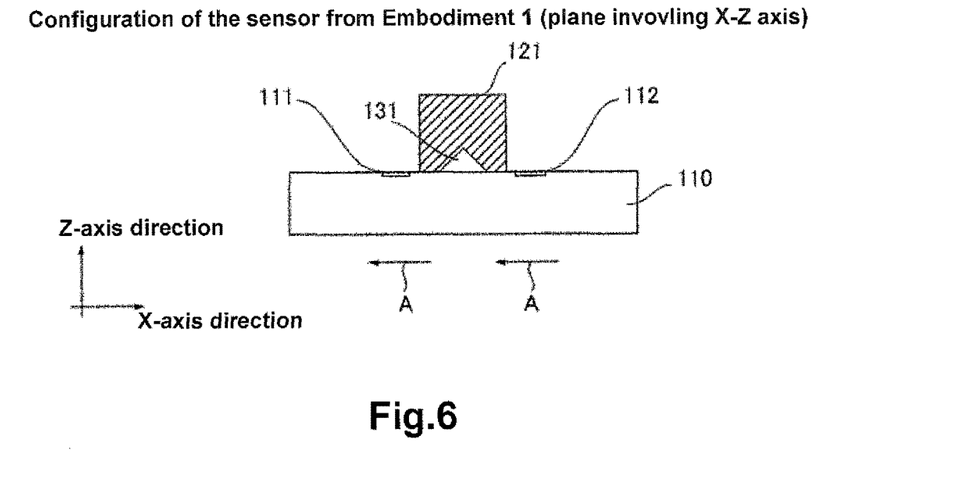
FIG. 6 is a view showing the configuration of the magnetic sensor in Embodiment 1 (the surface involving X-Z axis).
Figure 7:
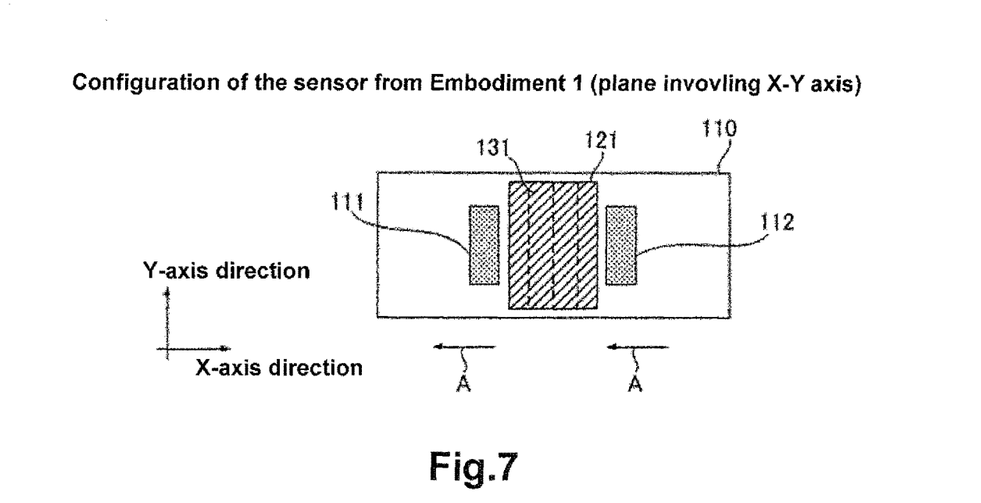
FIG. 7 is a view showing the configuration of the magnetic sensor in Embodiment 1 (the surface involving X-Y axis).
Figure 8:
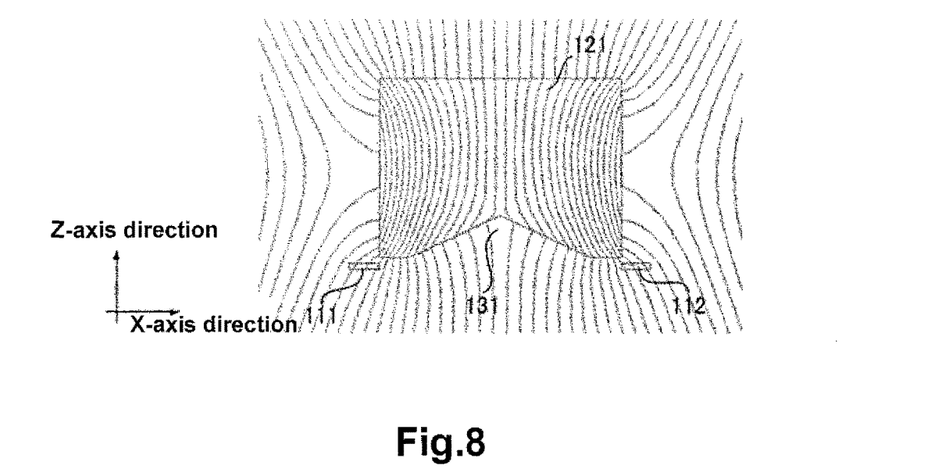
FIG. 8 is a schematic view showing the magnetic flux introduced to the GMR element part in Embodiment 1.
Figure 9:
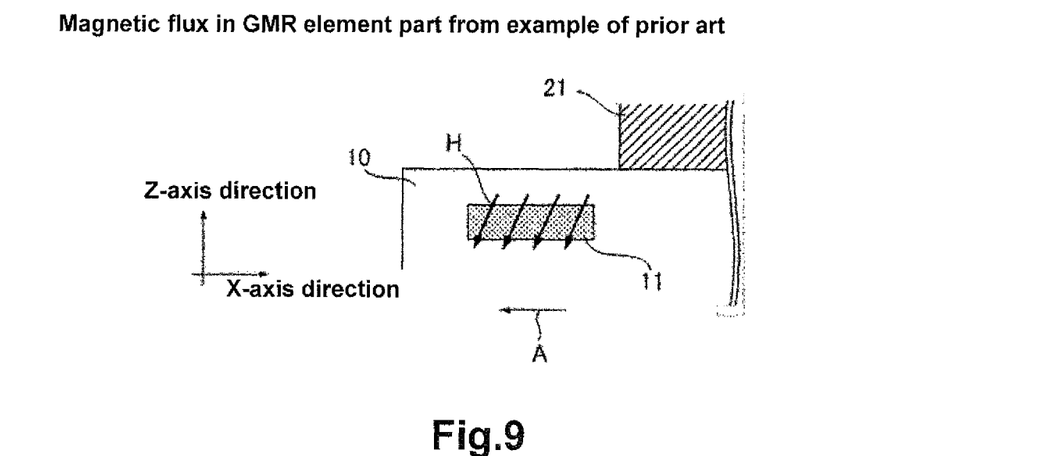
FIG. 9 is a view showing the enlarged GMR element part in the example of prior art.
Figure 10:
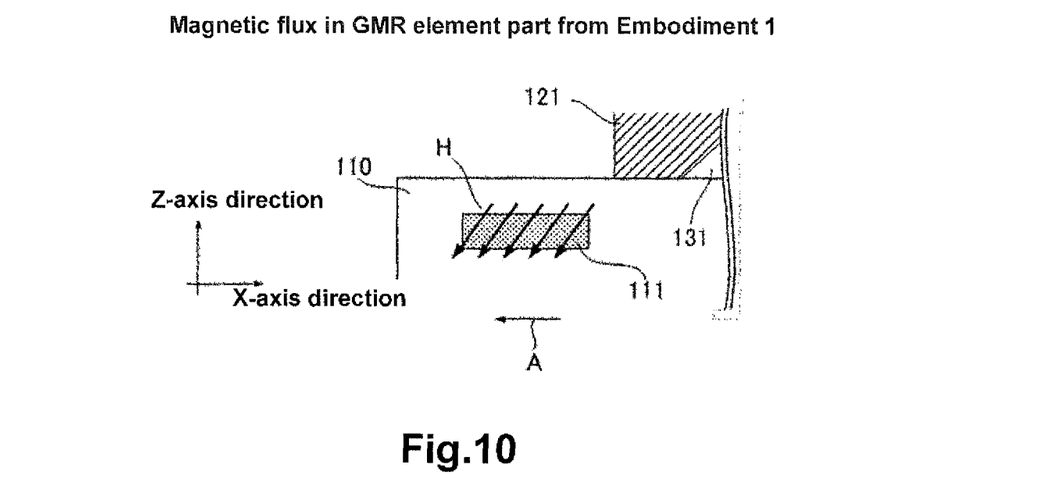
FIG. 10 is a view showing the enlarged GMR element part in Embodiment 1.
Figure 11:
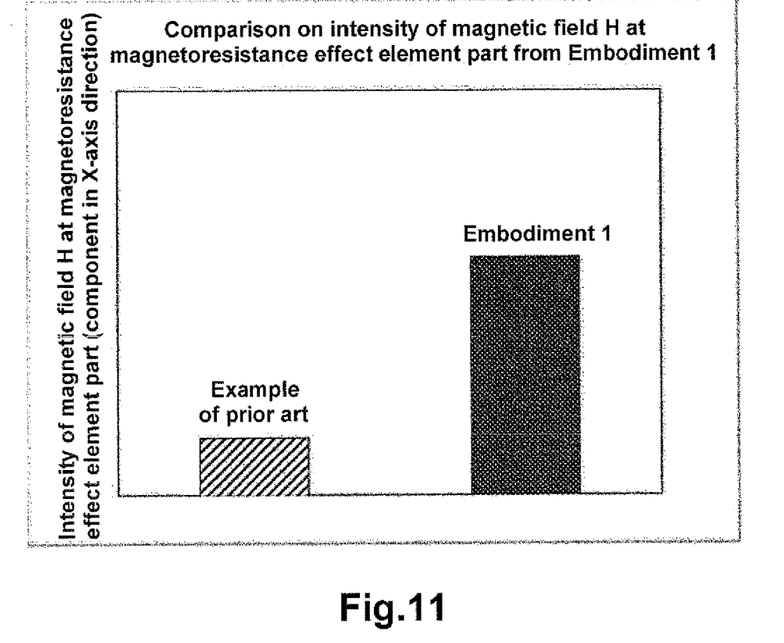
FIG. 11 shows the stimulation results in the example of prior art and Embodiment 1 about the intensity of the magnetic field at the magnetoresistance effect element part in the X-axis direction.

The first embodiment of the present invention will be described with reference to FIG. 6 to FIG. 11. FIG. 6 is a view showing the configuration of the magnetic sensor according to the present embodiment in the surface involving X-Z axis. FIG. 7 is a view showing the configuration of the magnetic sensor according to the present embodiment in the surface involving X-Y axis. FIG. 8 is a schematic view showing the magnetic field entering the GMR element part through the magnetic body in the present embodiment. FIG. 9 is a schematic view showing the magnetic field entering the GMR element part through the magnetic body in the example of prior art where the GMR element part is enlarged. FIG. 10 is a schematic view showing the magnetic field entering the GMR element part through the magnetic body in present embodiment where the GMR element part is enlarged. FIG. 11 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 6 and FIG. 7. GMR elements 111 and 112 are disposed in GMR chip 110. These GMR elements form a bridge circuit. In the vicinity of the bridge circuit, magnetic body 121 changing the direction of the magnetic field input to the magnetoresistance effect element is disposed. In addition, in magnetic body 121, recess 131 with a concave shape is disposed on the surface at a side where GMR elements 111 and 112 are formed, wherein recess 131 changes the direction of the magnetic field.

Further, on the surface with the X axis and the Z axis, the shape of recess 131 of magnetic body 121 is preferably a triangle with a bottom edge at the side of the element disposing surface. However, as long as the direction of magnetic field H can be changed, the shape may be a polygon having three or more sides.

Magnetic body 121 is the soft magnetic body made of the material such as the ferrite material, the permalloy (Ni—Fe alloy), Sendust (Fe—Si—Al alloy) or the like. The material is not restricted as long as magnetic body 121 functions to change the direction of magnetic field H.

Further, magnetic body 121 is preferably composed of one component. However, as long as magnetic body 121 is capable of changing the direction of magnetic field H, the number of the components to constitute magnetic body 121 is not particularly restricted.

[Function]

Hereinafter, magnetic field H introduced to GMR element parts 111 and 112 through the configuration mentioned above will be described with reference to FIG. 8 to FIG. 10. Similar to that in the example of prior art, the magnetic field entering magnetic body 121 from the upper part of the figure in Z-axis direction is bended by magnetic body 121 and is introduced into the interior of magnetic body 121.

Magnetic field H introduced into the interior of magnetic body 121 is guided towards the outside of magnetic body 121 in the X-axis direction through the concave shape in the vicinity of recess 131 of magnetic body 121. As a result, the magnetically concentrated magnetic field H enters the vicinity of GMR elements 111 and 112, so the intensity of the magnetic field to be detected is increased. Further, it can be seen from FIG. 9 and FIG. 10 where the GMR element parts from the example of prior art and the present example are enlarged that the intensity of the magnetic field is increased in the present embodiment due to the magnetically concentrated magnetic field in recess 131. In addition, if the incidence angles of magnetic field H entering the GMR element part with the effect mentioned above are compared, magnetic field H will be found to bend towards the X-axis direction in the present embodiment due to the effect produced by recess 131. As such, with respect to magnetic field H entering GMR element 111, not only the intensity of the magnetic field is increased, but also the component of magnetic field H in the X-axis direction is increased due to the bending of magnetic field H with the effects from magnetic body 121 and recess 131, wherein the magnetic induction occurs in the GMR element in the X-axis direction. Thus, the detection of the magnetic sensor can be improved in precision. Although not shown in the figure, at the opposite side along the X-axis, the same happens to magnetic field H entering GMR element 122 with the effects from magnetic body 121 and recess 131. As a result, the component of magnetic field H in the X-axis direction increases so that the detection precision of the magnetic sensor can be improved, wherein the magnetic induction occurs in the GMR element in the X-axis direction.

With reference to FIG. 11, a simulation is performed to predict the intensity of magnetic field H introduced to GMR element parts 111 and 112 through the configuration mentioned above, and the result is described and compared against that from the example of prior art. It can be confirmed in Embodiment 1 that the intensity of magnetic field H introduced to GMR element parts 111 and 112 is increased compared to that in the example of prior art.

With the functions mentioned above, the detection precision of the magnetic sensor can be improved by increasing the intensity of the magnetic field at the GMR element part.

(Embodiment 2)

Figure 12:
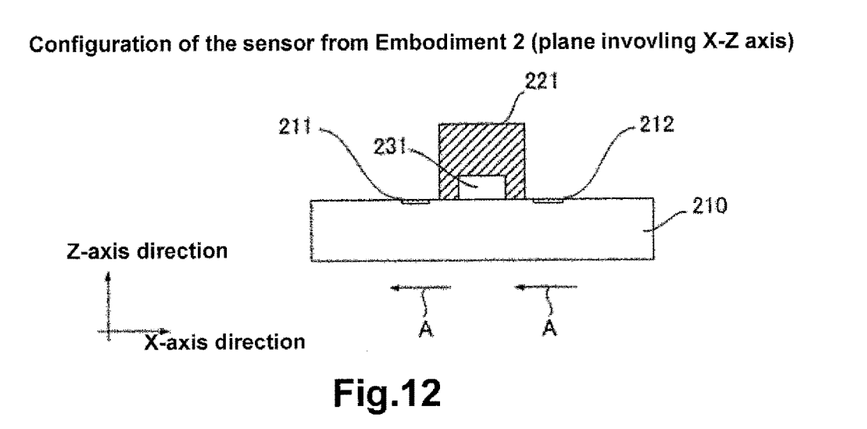
FIG. 12 is a view showing the configuration of the magnetic sensor in Embodiment 2 (the surface involving X-Z axis).
Figure 13:
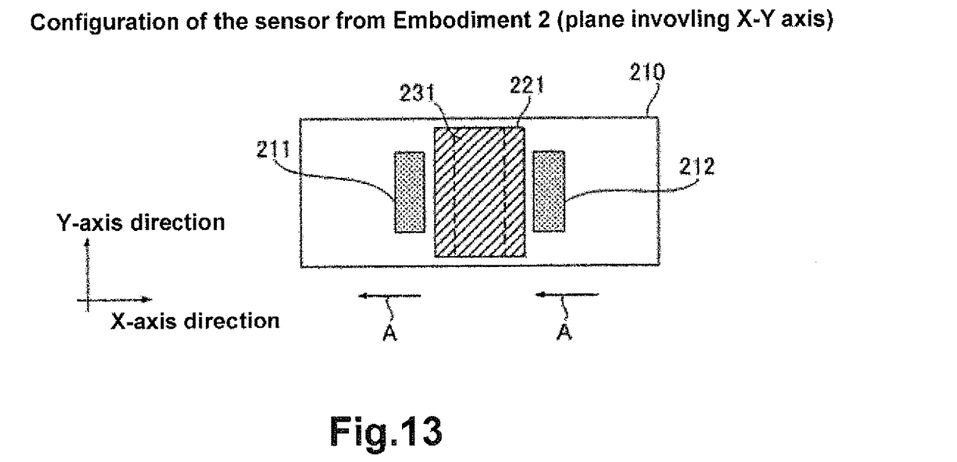
FIG. 13 is a view showing the configuration of the magnetic sensor in Embodiment 2 (the surface involving X-Y axis).
Figure 14:
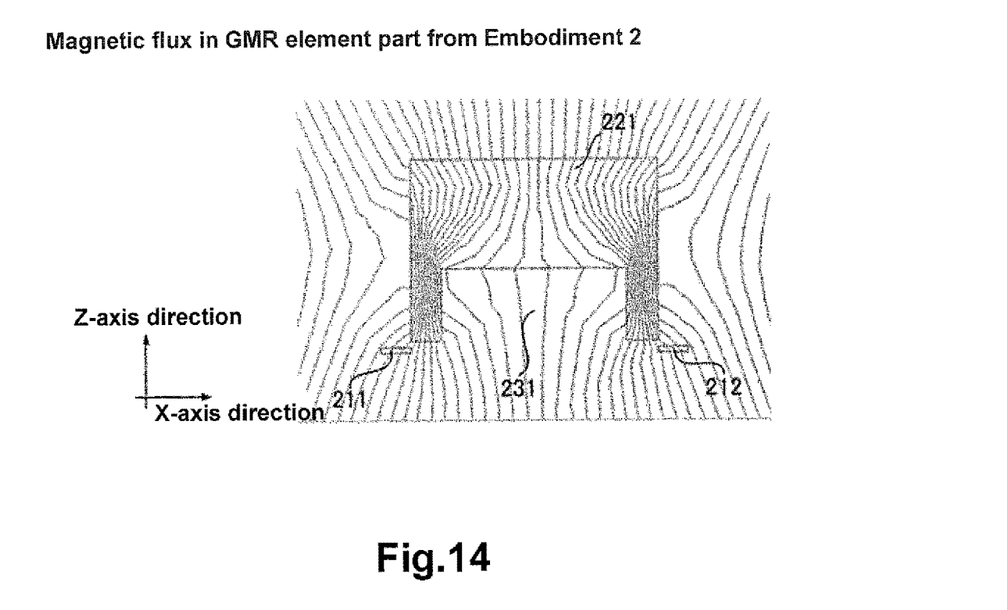
FIG. 14 is a schematic view showing the magnetic flux introduced to the GMR element part in Embodiment 2.
Figure 15:
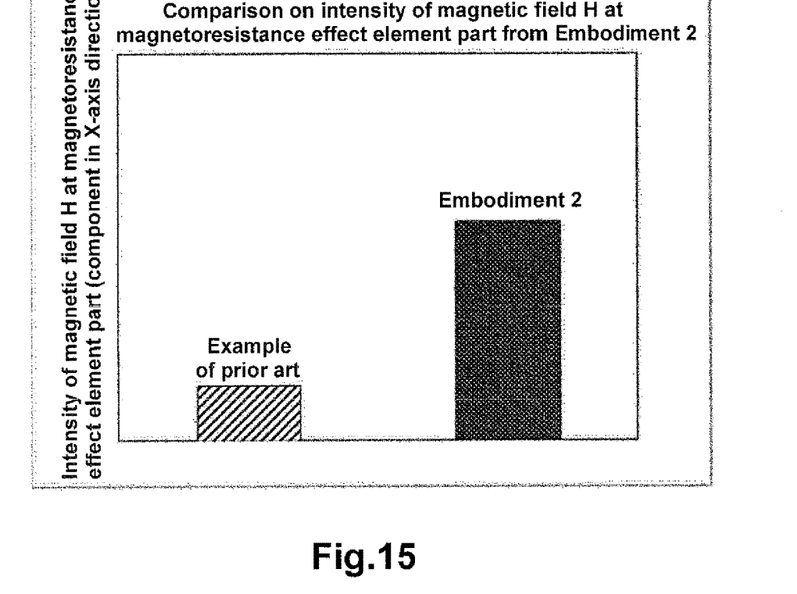
FIG. 15 shows the stimulation results in the example of prior art and Embodiment 2 about the intensity of the magnetic field at the magnetoresistance effect element part in the X-axis direction.

The second embodiment of the present invention will be described with reference to FIG. 12 to FIG. 15. FIG. 12 is a view showing the configuration of the magnetic sensor according to the present embodiment in the surface involving X-Z axis. FIG. 13 is a view showing the configuration of the magnetic sensor according to the present embodiment in the surface involving X-Y axis. FIG. 14 is a schematic view showing the magnetic field entering the GMR element part through the magnetic body in the present embodiment. FIG. 15 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 12 and FIG. 13. GMR elements 211 and 212 are formed in GMR chip 210. These GMR elements form a bridge circuit. In the vicinity of the bridge circuit, magnetic body 221 changing the direction of the magnetic field input to the magnetoresistance effect element is disposed. In addition, in magnetic body 221, recess 231 with a concave shape is disposed on the surface at a side where GMR elements 211 and 212 are formed, wherein recess 231 changes the direction of the magnetic field.

Further, on the surface with the X axis and the Z axis, the shape of recess 231 of magnetic body 221 is preferably a tetragon. However, as long as the direction of magnetic field H can be changed by recess 231, the shape can be the polygon having four or more sides.

Magnetic body 221 is the soft magnetic body made of the material such as the ferrite material, the permalloy (Ni—Fe alloy), Sendust (Fe—Si—Al alloy) or the like. The material is not restricted as long as magnetic body 221 functions to change the direction of magnetic field H.

Further, magnetic body 221 is preferably composed of one component. However, as long as magnetic body 221 is capable of changing the direction of magnetic field H, the number of the components to constitute magnetic body 221 is not particularly restricted.

[Function]

Hereinafter, magnetic field H introduced to GMR element parts 211 and 212 through the configuration mentioned above will be described with reference to FIG. 14. Similar to that in the example of prior art, the magnetic field entering magnetic body 221 from the upper part of the figure in Z-axis direction is bended by magnetic body 221 and is introduced into the interior of magnetic body 221.

Magnetic field H introduced into the interior of magnetic body 221 is guided towards the outside of magnetic body 221 in the X-axis direction through the concave shape in the vicinity of recess 231 of magnetic body 221. As a result, the magnetically concentrated magnetic field H enters the vicinity of GMR elements 211 and 212, so the intensity of the magnetic field to be detected is increased. Similar to Embodiment 1, the incidence angle of magnetic field H entering the GMR element part in the present embodiment bends to a large extent towards the direction where the magnetic induction of the GMR element occurs (the X-axis direction). As such, with respect to magnetic field H entering GMR element 211, not only the intensity of the magnetic field is increased, but also the component of magnetic field H in the X-axis direction is increased due to the bending of magnetic field H with the effects from magnetic body 221 and recess 231, wherein the magnetic induction occurs in the GMR element in the X-axis direction. Thus, the detection of the magnetic sensor can be improved in precision.

With reference to FIG. 15, a simulation is performed to predict the intensity of magnetic field H introduced to GMR element parts 211 and 212 through the configuration mentioned above, and the result is described and compared against that from the example of prior art. It can be confirmed in Embodiment 2 that the intensity of magnetic field H introduced to GMR element parts 211 and 212 is increased compared to that in the example of prior art.

With the functions mentioned above, the detection precision of the magnetic sensor can be improved by increasing the intensity of the magnetic field at the GMR element part.

(Embodiment 3)

Figure 16:
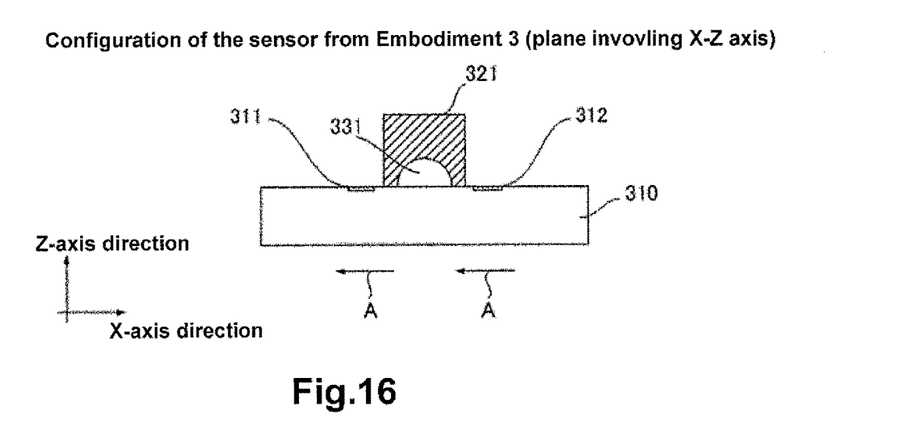
FIG. 16 is a view showing the configuration of the magnetic sensor in Embodiment 3 (the surface involving X-Z axis).
Figure 17:
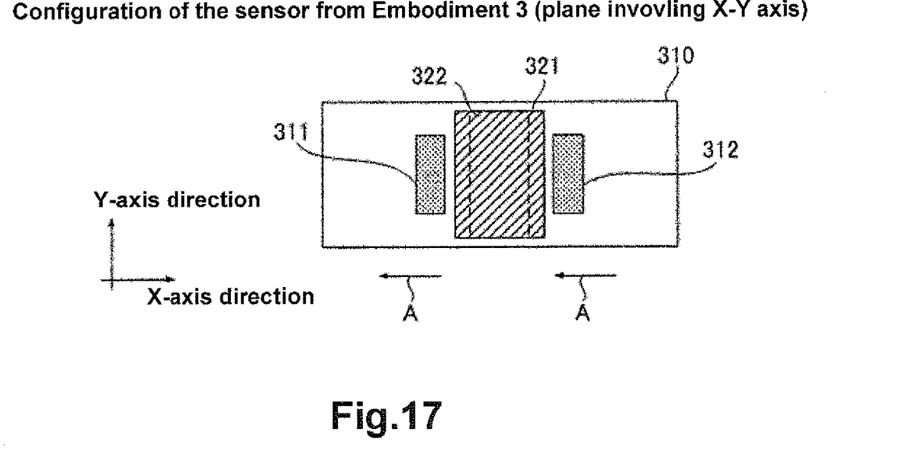
FIG. 17 is a view showing the configuration of the magnetic sensor in Embodiment 3 (the surface involving X-Y axis).
Figure 18:
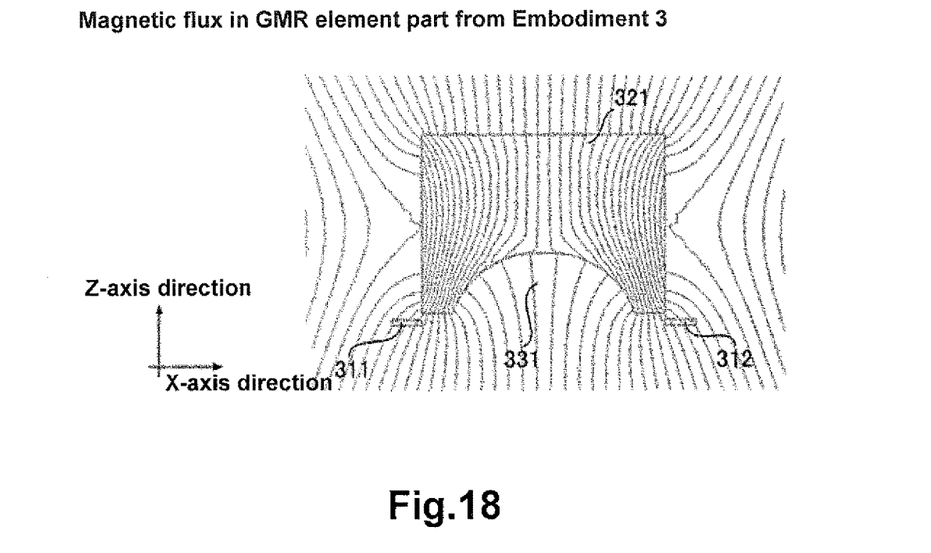
FIG. 18 is a schematic view showing the magnetic flux introduced to the GMR element part in Embodiment 3.
Figure 19:
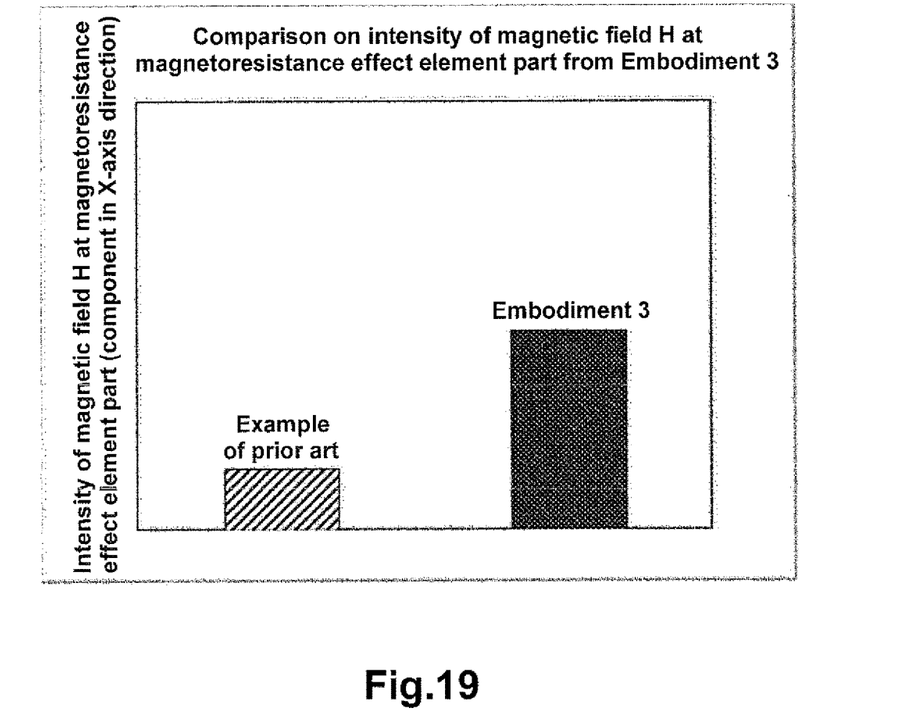
FIG. 19 shows the stimulation results in the example of prior art and Embodiment 3 about the intensity of the magnetic field at the magnetoresistance effect element part in the X-axis direction.

The third embodiment of the present invention will be described with reference to FIG. 16 to FIG. 19. FIG. 16 is a view showing the configuration of the magnetic sensor according to the present embodiment in the surface involving X-Z axis. FIG. 17 is a view showing the configuration of the magnetic sensor according to the present embodiment in the surface involving X-Y axis. FIG. 18 is a schematic view showing the magnetic field entering the GMR element part through the magnetic body in the present embodiment. FIG. 19 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 16 and FIG. 17. GMR elements 311 and 312 are disposed in GMR chip 310. Further, these GMR elements form a bridge circuit. In the vicinity of the bridge circuit, magnetic body 321 changing the direction of the magnetic field input to the magnetoresistance effect element is disposed. In addition, in magnetic body 321, recess 331 with a concave shape is disposed on the surface at a side where GMR elements 311 and 312 are formed, wherein recess 331 changes the direction of the magnetic field.

Further, on the surface with the X axis and the Z axis, the shape of recess 331 of magnetic body 321 is preferably a semi-circle. However, as long as the direction of magnetic field H can be changed by recess 331, recess 331 may be a shape comprising arc in part or the whole part. Further, recess 331 may be a shape in which the arc and the polygon are combined together.

Magnetic body 321 is the soft magnetic body made of the material such as the ferrite material, the permalloy (Ni—Fe alloy), Sendust (Fe—S—Al alloy) or the like. The material is not restricted as long as magnetic body 321 functions to change the direction of magnetic field H.

Further, magnetic body 321 is preferably composed of one component. However, as long as magnetic body 321 is capable of changing the direction of magnetic field H, the number of the components to constitute magnetic body 321 is not particularly restricted.

[Function]

Hereinafter, magnetic field H introduced to GMR element parts 311 and 312 through the configuration mentioned above will be described with reference to FIG. 18. Similar to that in the example of prior art, the magnetic field entering magnetic body 321 from the upper part of the figure in Z-axis direction is bended by magnetic body 321 and is introduced into the interior of magnetic body 321.

Magnetic field H introduced into the interior of magnetic body 321 is guided towards the outside of magnetic body 321 in the X-axis direction through the concave shape in the vicinity of recess 331 of magnetic body 321. As a result, the magnetically concentrated magnetic field H enters the vicinity of GMR elements 311 and 312, so the intensity of the magnetic field to be detected is increased. Similar to Embodiment 1, the incidence angle of magnetic field H entering the GMR element part in the present embodiment bends to a large extent towards the direction where the magnetic induction of the GMR element occurs (the X-axis direction). As such, with respect to magnetic field H entering GMR element 311, not only the intensity of the magnetic field is increased, but also the component of magnetic field H in the X-axis direction is increased due to the bending of magnetic field H with the effects from magnetic body 321 and recess 331, wherein the magnetic induction occurs in the GMR element in the X-axis direction. Thus, the detection of the magnetic sensor can be improved in precision.

With reference to FIG. 19, a simulation is performed to predict the intensity of magnetic field H introduced to GMR element parts 311 and 312 through the configuration mentioned above, and the result is described and compared against that from the example of prior art. It can be confirmed in Embodiment 3 that the intensity of magnetic field H introduced to GMR element parts 311 and 312 is increased compared to that in the example of prior art.

With the functions mentioned above, the detection precision of the magnetic sensor can be improved by increasing the intensity of the magnetic field at the GMR element part.

INDUSTRIAL APPLICATION

The present invention can be applied to various measuring devices such as the magnetic sensor, the galvanometer and the encoder. Thus, the present invention can be utilized in the industry.

DESCRIPTION OF REFERENCE NUMERALS

1 GMR chip
10 GMR chip in example of prior art
11, 12 element disposing part in example of prior art
21 magnetic body in example of prior art
110 GMR chip in Embodiment 1
111, 112 element disposing part in Embodiment 1
121 magnetic body in Embodiment 1
131 recess in Embodiment 1 for changing magnetic field
210 GMR chip in Embodiment 2
211, 212 element disposing part in Embodiment 2
221 magnetic body in Embodiment 2
231 recess in Embodiment 2 for changing magnetic field
310 GMR chip in Embodiment 3
311, 312 element disposing part in Embodiment 3
321 magnetic body in Embodiment 3
331 recess in Embodiment 3 for changing magnetic field
A fixed direction of magnetization
H mangetic field

What is claimed is:
1. A magnetic sensor comprising:
a chip having a placement surface;
a first magnetoresistance effect element located on the placement surface;
a second magnetoresistance effect element located on the placement surface, the second magnetoresistance effect element being separate on the placement surface from the first magnetoresistance effect element; and
a magnetic body that is provided on the placement surface, the magnetic body being located between the first and second magnetoresistance effect elements when viewed in a direction perpendicular to the placement surface, wherein the magnetic body changes a direction of a magnetic field input to the first and second magnetoresistance effect elements, resistance values of the first and second magnetoresistance effect elements change according to the direction of the input magnetic field, the magnetic body has a recess with a concave shape on a side of the magnetic body that faces the placement surface, and the recess faces a portion of the placement surface that is between the first and second magnetoresistance effect elements, and does not face any of the first and second magnetoresistance effect elements.

2. The magnetic sensor according to claim 1, wherein the recess of the magnetic body is provided on the side of the placement surface of the magnetic body, and the center of the recess has a center that is substantially identical to that of the magnetic body in the direction perpendicular to the placement surface.

3. The magnetic sensor according to claim 1, wherein, the concave shape at least includes polygon having three or more sides.

4. The magnetic sensor according to claim 1, wherein, the concave shape at least includes arc.

5. The magnetic sensor according to claim 1, wherein, the magnetic body is a soft magnetic body.

6. The magnetic sensor according to claim 2, wherein, the concave shape at least includes polygon having three or more sides.

7. The magnetic sensor according to claim 2, wherein, the concave shape at least includes arc.

8. The magnetic sensor according to claim 2, wherein, the magnetic body is a soft magnetic body.

9. The magnetic sensor according to claim 3, wherein, the magnetic body is a soft magnetic body.

10. The magnetic sensor according to claim 4, wherein, the magnetic body is a soft magnetic body.

11. The magnetic sensor according to claim 6, wherein, the magnetic body is a soft magnetic body.

12. The magnetic sensor according to claim 7, wherein, the magnetic body is a soft magnetic body.

13. The magnetic sensor according to claim 1, wherein the first and second magnetoresistance elements form a bridge circuit.

* * * * *